(12) United States Patent
Mori et al.

(10) Patent No.: US 6,475,557 B1
(45) Date of Patent: Nov. 5, 2002

(54) METHOD FOR MANUFACTURING OPTICAL FILTER

(75) Inventors: Kunihiko Mori, Yokosuka (JP); Yoshitada Katagiri, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 09/383,659

(22) Filed: Aug. 26, 1999

(30) Foreign Application Priority Data

Aug. 26, 1998 (JP) .......................................... 10-240130

(51) Int. Cl.⁷ ............................... B05D 5/06; B05D 1/32
(52) U.S. Cl. ....................... 427/162; 427/282; 427/571; 427/585; 204/192.11; 204/192.26
(58) Field of Search ........................ 427/163.1, 163.2, 427/164, 166, 248.1, 255.7, 282, 585, 571, 162; 204/192.11, 192.26

(56) References Cited

U.S. PATENT DOCUMENTS

| | | | |
|---|---|---|---|
| 3,530,824 A | | 9/1970 | Illsley et al. |
| 3,859,131 A | * | 1/1975 | Miles ....................... 427/163.1 |
| 4,022,928 A | * | 5/1977 | Piwczyk ....................... 427/154 |
| 4,543,910 A | | 10/1985 | Dobrowolski |
| 5,032,461 A | * | 7/1991 | Shaw et al. .................... 427/81 |
| 5,731,898 A | * | 3/1998 | Orzi et al. ................... 359/587 |
| 5,866,204 A | * | 2/1999 | Robbie et al. ........... 427/248.1 |
| 5,872,655 A | * | 2/1999 | Seddon et al. ............... 427/162 |

FOREIGN PATENT DOCUMENTS

| | | | |
|---|---|---|---|
| JP | | 5214426 | 12/1977 |
| JP | | 3-2802 | 1/1991 |
| JP | | 3-002802 | * 1/1991 |
| JP | | 8 86914 | 4/1996 |
| JP | | 9-243822 | * 9/1997 |
| JP | | 9-324267 | 12/1997 |
| JP | | 10-110259 | 4/1998 |

OTHER PUBLICATIONS

"Synchro–Scanned Rotating Tunable Optical Disk Filter for Wavelength Discrimination", Katagiri, *IEEE Photonics Technology Letters,* vol. 10, No. 1, Mar. 1998 pp 400–402.

"Circularly Wedged Optical Coatings", Thelen, *Applied Optics,* vol. 4, No. 8, Aug. 1965 pp 977–985.

* cited by examiner

*Primary Examiner*—Bret Chen
(74) *Attorney, Agent, or Firm*—Kilpatrick Stockton LLP

(57) ABSTRACT

A method for manufacturing an optical filter capable of manufacturing an optical filter in such a manner that the transmission wavelength varies linearly with respect to the angle θ in the rotation direction of the substrate and that almost the entire range of the angle θ is utilizable as the optical filter. A mask capable of being rotated relatively with respect to the substrate coaxially on a plane parallel to the substrate, which is either having an aperture extending along a radius direction with an aperture angle φ or itself extending along a radius direction to cover an angle φ, is provided over the substrate. Then, the mask is relatively rotated with respect to the substrate at least once at a non-constant angular speed during a formation of a single layer or multiple layers on the substrate, while depositing a dielectric material in a single layer or multiple layers on the substrate from the mask side within a deposition chamber.

22 Claims, 14 Drawing Sheets

METHOD FOR MANUFACTURING OPTICAL FILTER

BACKGROUND OF THE INVENTION

1. Field of the Invention

The present invention relates to a method for manufacturing an optical filter having a single layer or multiple layers of dielectric material deposited on a substrate.

2. Description of the Background Art

Conventionally, a dielectric single layer film filter or dielectric multi-layer film filter formed by depositing dielectric materials on a glass substrate has been used as an optical filter for wavelength selection purpose. In such an optical filter, the transmission wavelength is made variable by varying the thickness of deposition of the dielectric material in a planar direction of the filter. Such an optical filter is manufactured by depositing the dielectric material while giving a planar distribution in the dielectric material deposition thickness at a time of depositing a dielectric film 2 on a disk shaped substrate 1 as shown in Fig. In this way, it is possible to realize an optical filter with the transmission wavelength varying with respect to an angle $\theta$ (=0 to $2\pi$) along the direction of rotation of the substrate 1. See U.S. patent application Ser. No. 09/174,724, now U.S. Pat. No. 6,157,025, for further detail.

Such an optical filter should preferably have a characteristic that the transmission wavelength varies linearly with respect to the rotation angle $\theta$ of the substrate 1. In this regard, the conventional manufacturing method has employed a film formation method in which the deposition time of the dielectric material is varied linearly with respect to the angle $\theta$, i.e., in the spiral shape, by using a shutter 3 that can be opened or closed like fans as shown in FIG. 2.

However, this method using the fan shaped shutter 3 of FIG. 2 inevitably leaves a region of the angle $\theta$ on which no dielectric material is deposited on the substrate 1. Namely, even when the shutter 3 is fully opened, there remains a region which is continually covered by the shutter 3 as shown in FIG. 3, so that this region cannot be utilized as the optical filter. Also, in this method, it is difficult to smoothly move the shutter 3 up to a fully opened state, so that it has been impossible to deposit the dielectric material at sufficient precision. For this reason, it has been impossible to realize an optical filter in which almost the entire range of the angle $\theta$ is utilizable as the optical filter.

SUMMARY OF THE INVENTION

It is therefore an object of the present invention to provide a method for manufacturing an optical filter capable of manufacturing an optical filter in such a manner that the transmission wavelength varies linearly with respect to the angle $\theta$ in the rotation direction of the substrate and that almost the entire range of the angle $\theta$ is utilizable as the optical filter.

According to one aspect of the present invention there is provided a method for manufacturing a disk shaped optical filter, comprising the steps of: providing a mask over a substrate, the mask being capable of being rotated relatively with respect to the substrate coaxially on a plane parallel to the substrate and the mask having an aperture extending along a radius direction with an aperture angle $\phi$; and depositing a dielectric material in a single layer or multiple layers on the substrate from the mask side within a deposition chamber, while relatively rotating the mask with respect to the substrate at least once at a non-constant angular speed during a formation of the single layer or the multiple layers on the substrate.

According to another aspect of the present invention there is provided a method for manufacturing a disk shaped optical filter, comprising the steps of: providing a mask over a substrate, the mask being capable of being rotated relatively with respect to the substrate coaxially on a plane parallel to the substrate and the mask extending along a radius direction to cover an angle $\phi$; and depositing a dielectric material in a single layer or multiple layers on the substrate from the mask side within a deposition chamber, while relatively rotating the mask with respect to the substrate at least once at a non-constant angular speed during a formation of the single layer or the multiple layers on the substrate.

Other features and advantages of the present invention will become apparent from the following description taken in conjunction with the accompanying drawings.

DETAILED DESCRIPTION OF THE PREFERRED EMBODIMENTS

Figure 1:
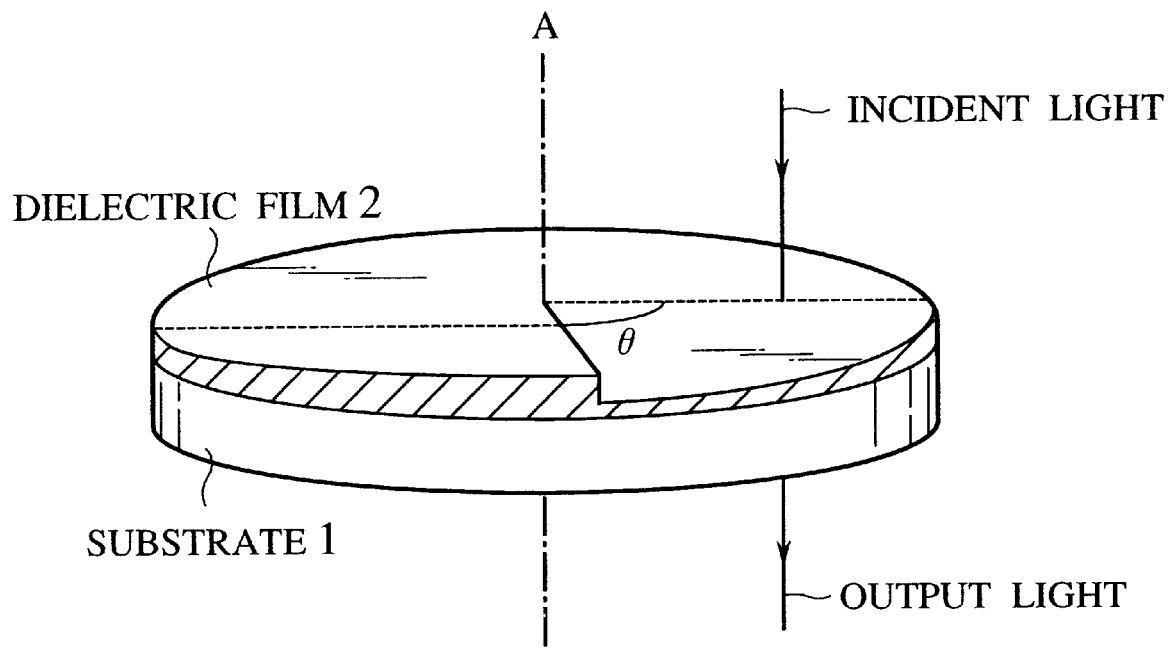
FIG. 1 is a diagram showing an exemplary optical filter having planar dielectric thickness of deposition distribution.
Figure 2:
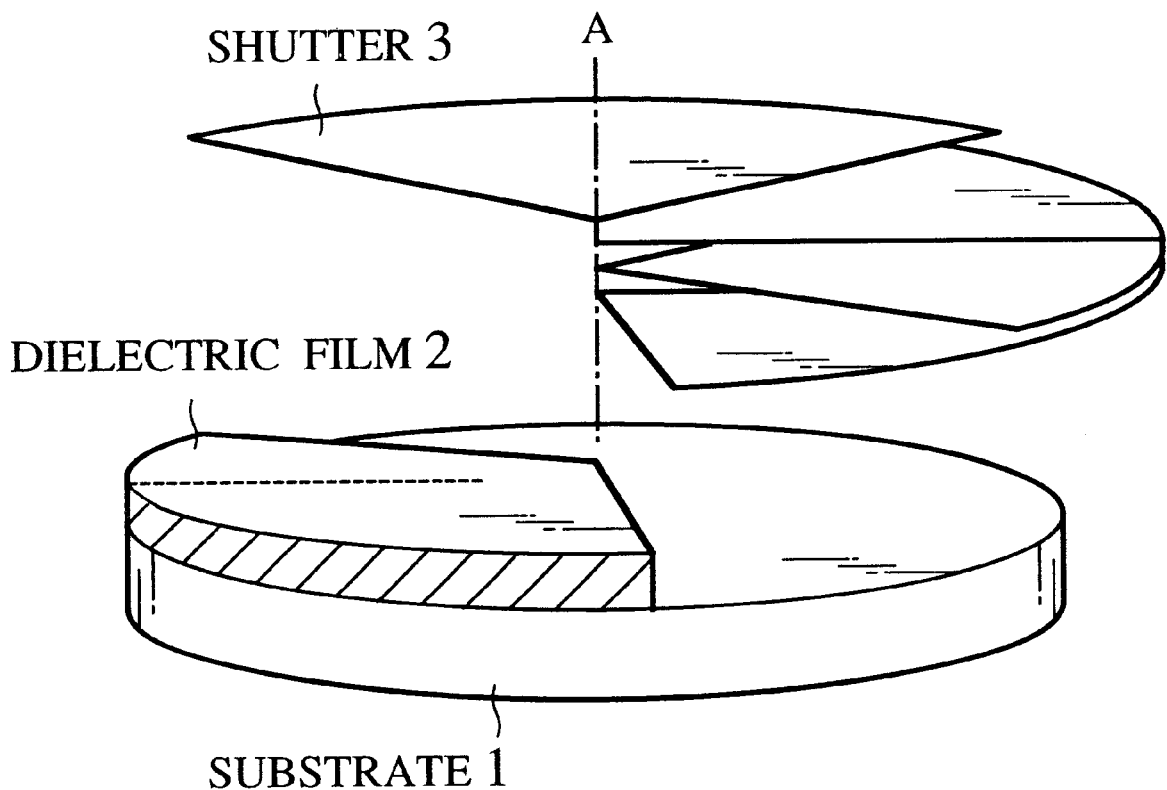
FIG. 2 is a diagram for explaining a conventional method for forming a dielectric film of an optical filter using a fan shaped shutter.
Figure 3:
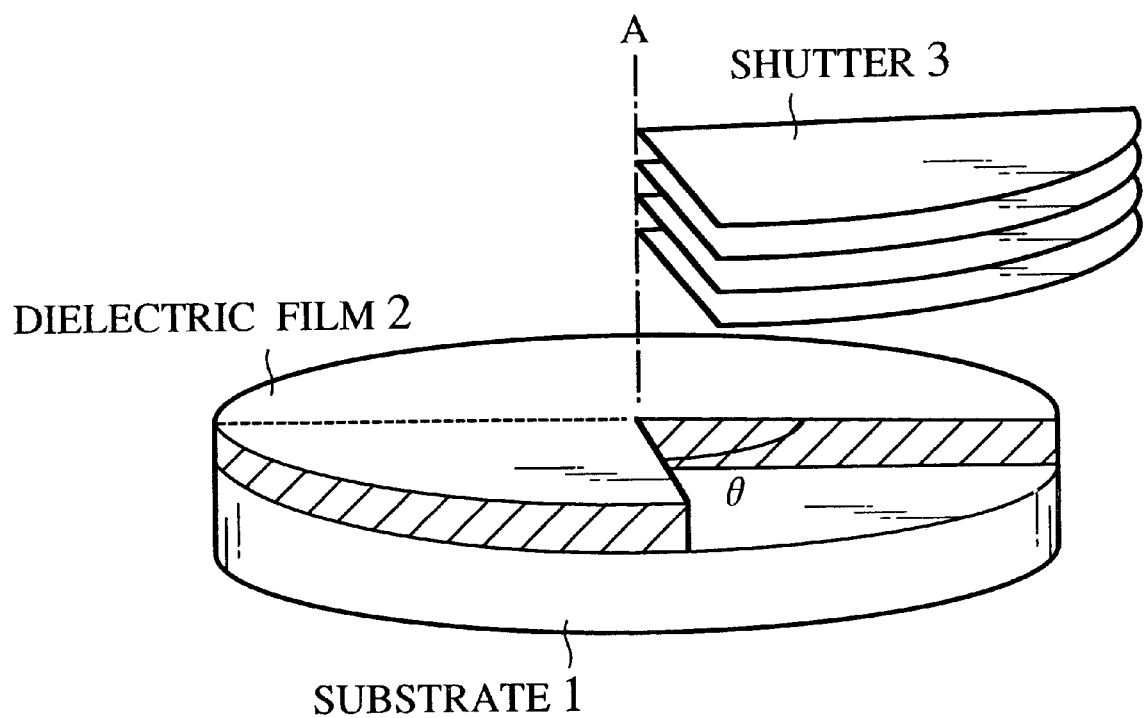
FIG. 3 is is a diagram showing a state in which the fan shaped shutter of FIG. 2 is fully opened in the conventional method.
Figure 4:
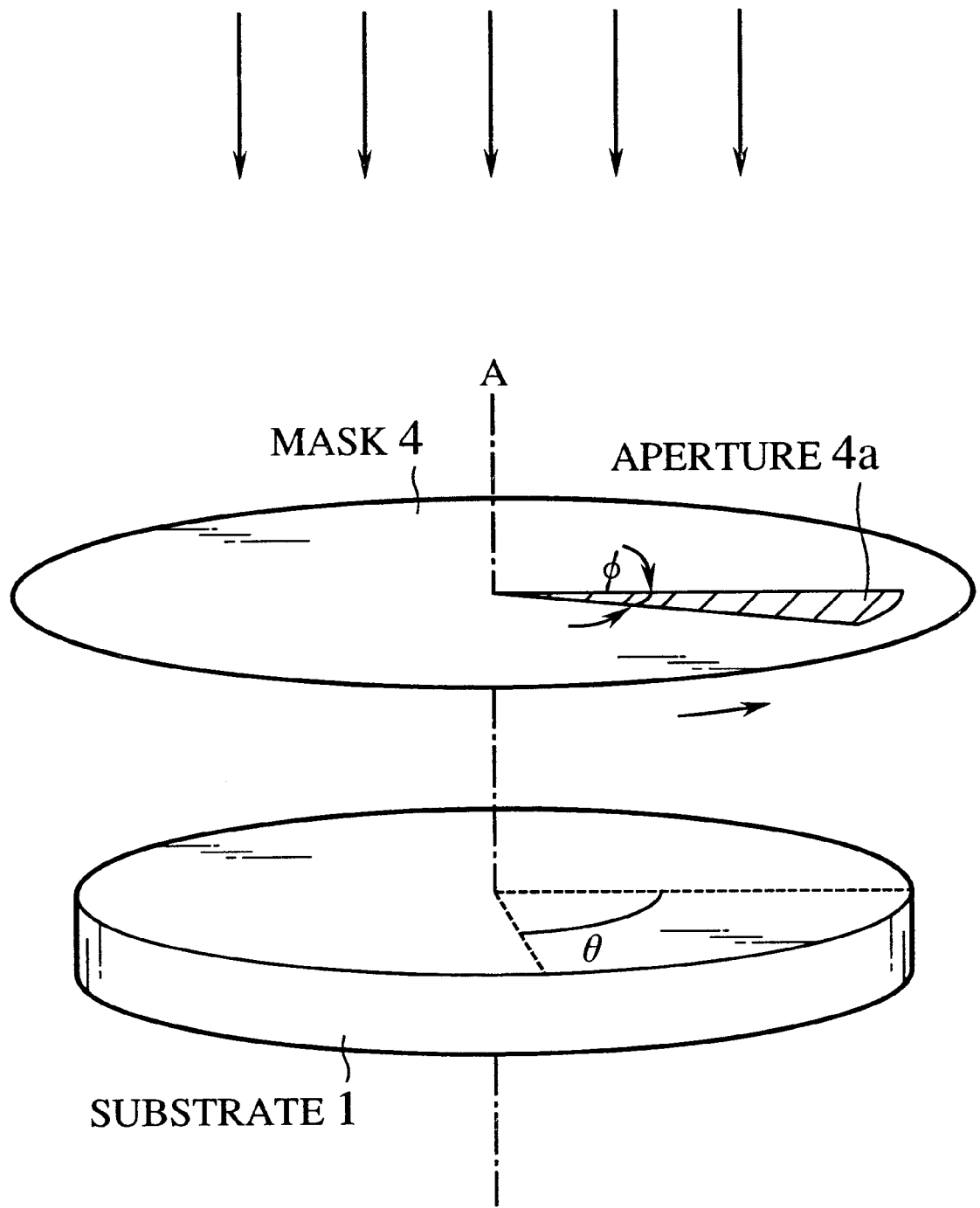
FIG. 4 is a diagram showing a configuration used in the optical filter manufacturing method according to the first embodiment of the present invention.
Figure 5:
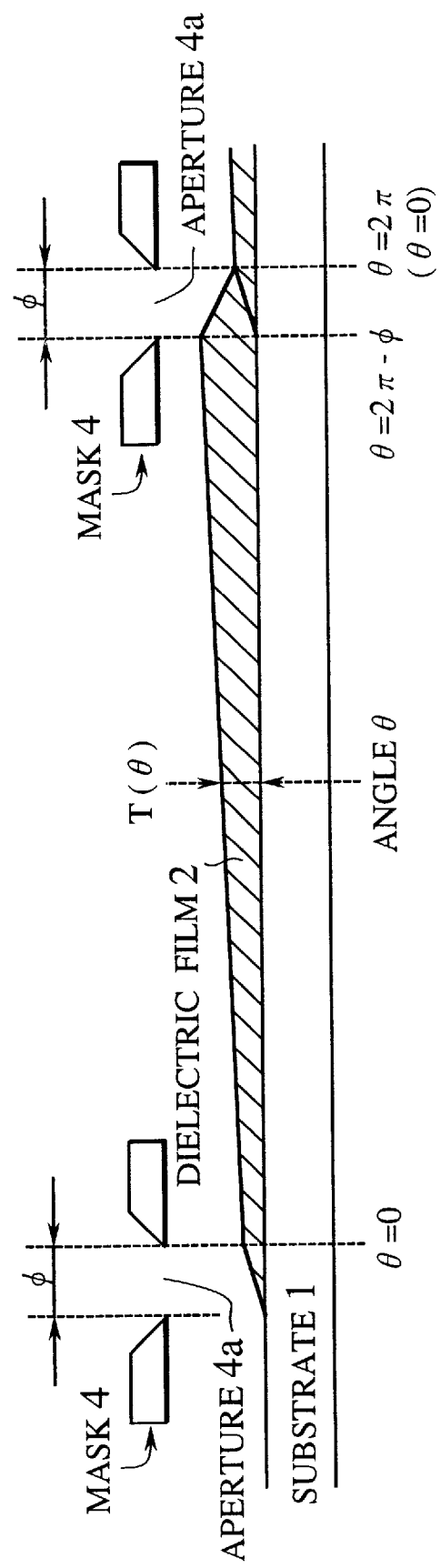
FIG. 5 is a diagram showing an operation principle of the optical filter manufacturing method according to the first embodiment of the present invention.

Referring now to FIG. 4 and FIG. 5, the first embodiment of the optical filter manufacturing method according to the present invention will be described in detail.

The optical filter manufacturing method of this first embodiment basically uses a setting as shown in FIG. 4, in which the substrate 1 is covered by a mask 4 with an aperture 4a of an angle $\phi$ with respect to the rotation direction of the substrate 1, and this mask 4 is rotated with respect to the substrate 1 at a time of depositing the dielectric material on the substrate 1 from the mask 4 side within a deposition chamber (not shown).

FIG. 5 shows an operation principle of this optical filter manufacturing method in which the rotation of the mask 4 with respect to the substrate 1 is represented linearly along the rotation direction. Note that, in FIG. 5, only a part of the mask 4 around the aperture 4a is shown for the sake of simplicity, so that the entire range except for a range under the aperture 4a is actually covered by the mask 4. Here, a time at which the mask 4 reaches to the angle $\theta$ starting from the angle $\theta=0$ will be denoted as $t(\theta)$. In the case where the dielectric material is deposited at a constant thickness of deposition per unit time, the thickness of deposition $T(\theta)$ at a position of the angle $\theta$ (=0 to $2\pi-\phi$) becomes proportional to the time for which this position is exposed under the aperture 4a. Consequently, a relationship between the thickness of deposition $T(\theta)$ and the time $t(\theta)$ can be expressed by the following difference equation (1):

$$T(\theta)=A[t(\theta+\phi)-t(\theta)] \qquad (1)$$

where A is a thickness of deposition that is deposited per unit time.

Arbitrary thickness of deposition distribution $T(\theta)$ can be realized by obtaining $t(\theta)$ that satisfies the equation (1). The motion $\theta(t)$ of the mask 4 will be given by an inverse function of $t(\theta)$ so that $t(\theta)$ is required to be a monotonously increasing function in a range of $0 \leq \theta \leq 2\pi$.

As shown in FIG. 5, there will be a discrepancy from the desired thickness of deposition $T(\theta)$ at angles in a range of $2\pi-\phi \leq \theta \leq 2\pi$ that correspond to the start and the end of the film formation, but by making $\phi$ sufficiently smaller than $2\pi$, it is possible to realize the desired thickness of deposition distribution $T(\theta)$ over almost all values of $\theta$.

Note that the thickness of deposition at angles in a range of $0 \leq \theta < 2\pi-\phi$ is proportional to a time since the right edge of the aperture passes a position of an angle $\theta$ until the left edge passes that position. In contrast, at angles in a range of $2\pi-\phi \leq \theta < \pi$, the left edge of the aperture passes a position of an angle $\theta$ first, and the right edge of the aperture passes that position at the end of one rotation of the aperture. When the aperture moves according to FIGS. 8 and 9, the passing speed of the right edge of the aperture in the range of $0 \leq \theta < 2\pi-\phi$ is always faster than that of the left edge so that the thickness of deposition increases as an angle $\theta$ increases. On the contrary, in the range of $2\pi-\phi \leq \theta < \pi$, the passing speed of the right edge of the aperture is always slower than that of the left edge, so that the thickness of deposition decreases as an angle $\theta$ increases. For this reason, the slope of the thickness of deposition in the range of $2\pi-\phi \leq \theta < \pi$ is different from that in the range of $0 \leq \theta < 2\pi-\phi$ as shown in FIG. 5.

Figure 6:
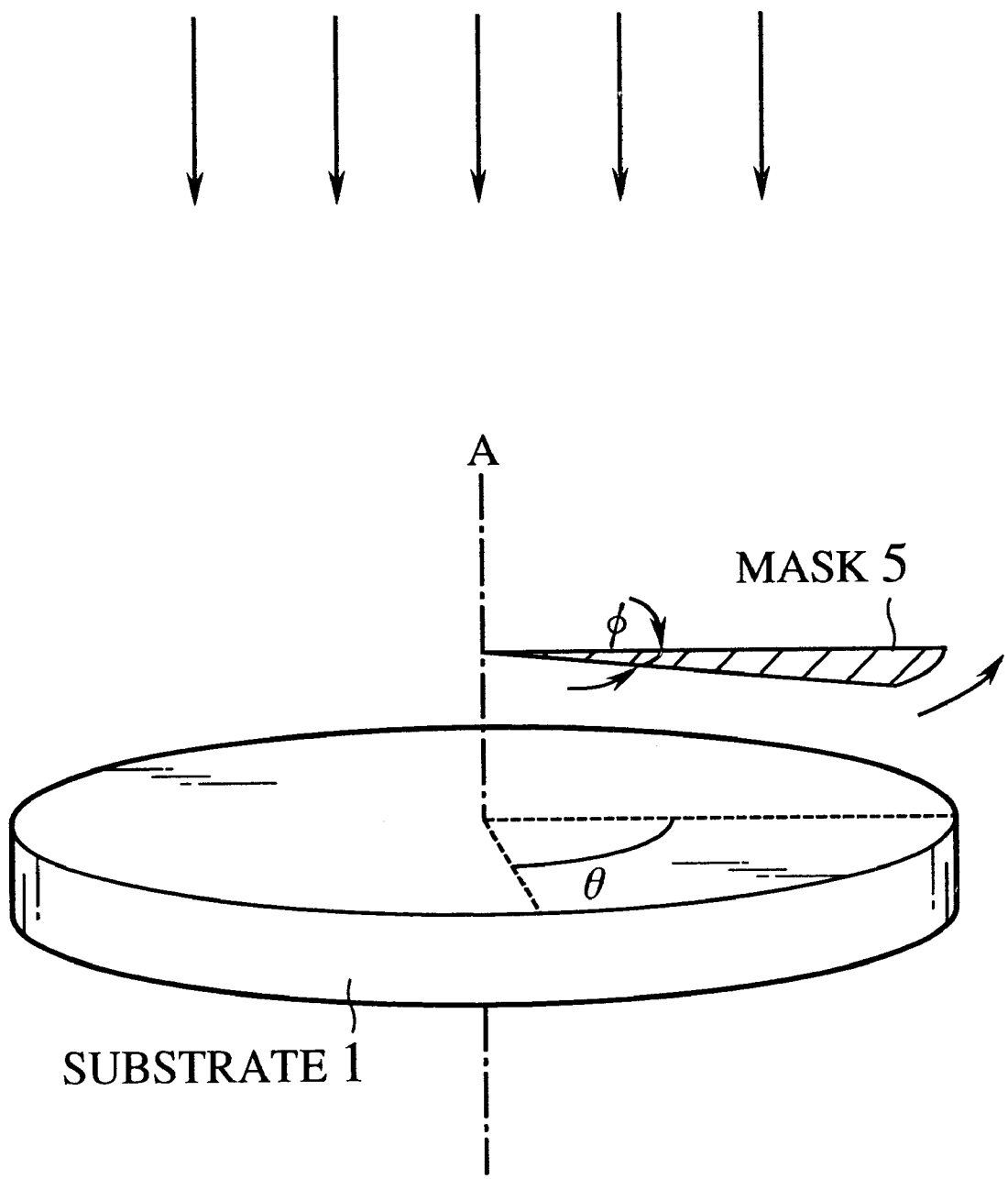
FIG. 6 is a diagram showing a configuration used in the optical filter manufacturing method according to the second embodiment of the present invention.
Figure 7:
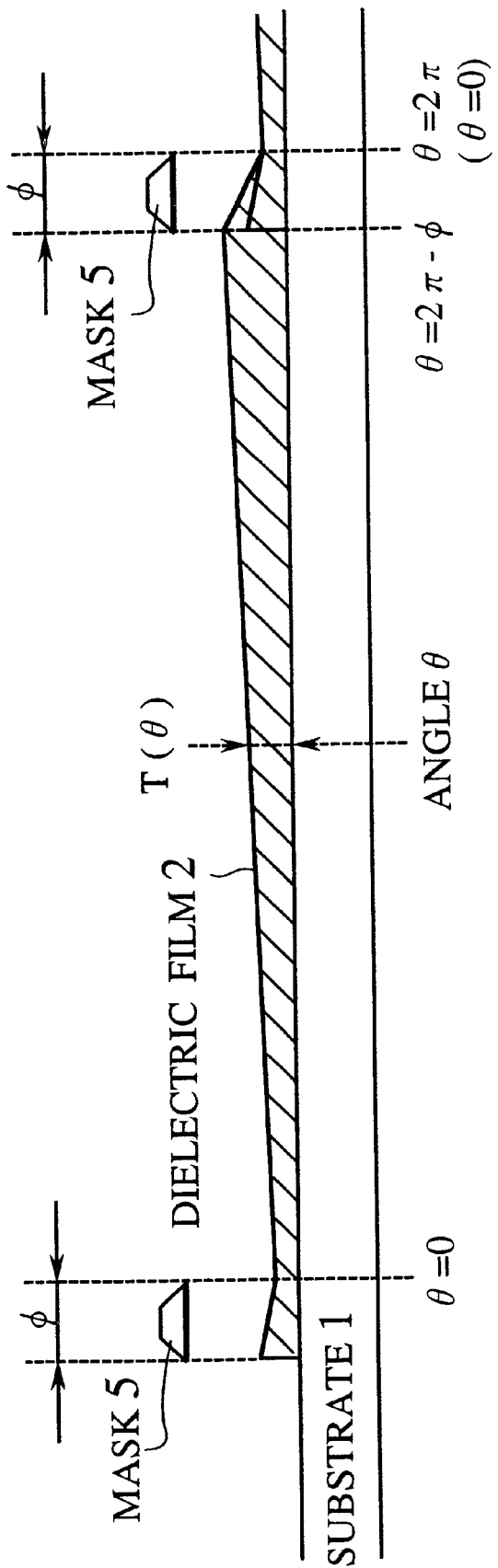
FIG. 7 is a diagram showing an operation principle of the optical filter manufacturing method according to the second embodiment of the present invention.

Referring next to FIG. 6 and FIG. 7, the second embodiment of the optical filter manufacturing method according to the present invention will be described in detail.

The optical filter manufacturing method of this second embodiment basically uses a setting as shown in FIG. 6, in which the substrate 1 is covered by a mask 5 that can cover an angle $\phi$ with respect to the rotation direction of the substrate 1, and this mask 5 is rotated with respect to the substrate 1 at a time of depositing the dielectric material on the substrate 1 from the mask 5 side within a deposition chamber (not shown).

FIG. 7 shows an operation principle of this optical filter manufacturing method in which the rotation of the mask 5 with respect to the substrate 1 is represented linearly along the rotation direction. In this case, a relationship between the thickness of deposition $T(\theta)$ and the time $t(\theta)$ can be expressed by the following difference equation (2):

$$T(\theta)=A[(t(2\pi)-t(0))-(t(\theta+\phi)-t(\theta))] \qquad (2)$$

where $t(2\pi)-t(0)$ represents a rotation period of the mask 5. Similarly as in the first embodiment, arbitrary thickness of deposition distribution $T(\theta)$ can be realized by obtaining $t(\theta)$ that satisfies the equation (2).

Also, in this case, there will be a discrepancy from the desired thickness of deposition $T(\theta)$ at angles in a range of $2\pi-\phi \leq \theta < 2\pi$ that correspond to the start and the end of the film formation, but by making $\phi$ sufficiently smaller than $2\pi$, it is possible to realize the desired thickness of deposition distribution $T(\theta)$ over almost all values of $\theta$.

Note that the thickness of deposition at angles in a range of $0 \leq \theta < 2\pi-\phi$ is proportional to a time since the right edge of the mask passes a position of an angle $\theta$ until the left edge passes that position. In contrast, at angles in a range of $2\pi-\phi \leq \theta < \pi$, the left edge of the mask passes a position of an angle $\theta$ first, and the right edge of the mask passes that position at the end of one rotation of the mask. When the mask moves according to FIGS. 10 and 11, the passing speed of the right edge of the mask in the range of $0 \leq \theta < 2\pi-\phi$ is always slower than that of the left edge so that the thickness of deposition increases as an angle $\theta$ increases. On the contrary, in the range of $2\pi-\phi \leq \theta < 2\pi$, the passing speed of the right edge of the mask is always faster than that of the left edge, so that the thickness of deposition decreases as an angle $\theta$ increases. For this reason, the slope of the thickness of deposition in the range of $2\pi-\phi \leq \theta < 2\pi$ is different from that in the range of $0 \leq \theta < 2\pi-\phi$ as shown in FIG. 7.

In the first and second embodiments described above, by selecting $t(\theta)$ in relation to each dielectric material to be deposited, it is possible to realize a variety of thickness of deposition distributions $T(\theta)$ by using a single mask 4 or 5.

Also, in the above description, the mask 4 or 5 is rotated with respect to the fixed substrate 1 at a time of depositing the dielectric material as shown in FIG. 4 or FIG. 6, but conversely it is also possible to rotate the substrate 1 with respect to the fixed mask 4 or 5 instead.

Referring next to FIG. 8 to FIG. 13, some specific examples of the optical filter manufacturing method according to the present invention will be described in detail.

Figure 8:
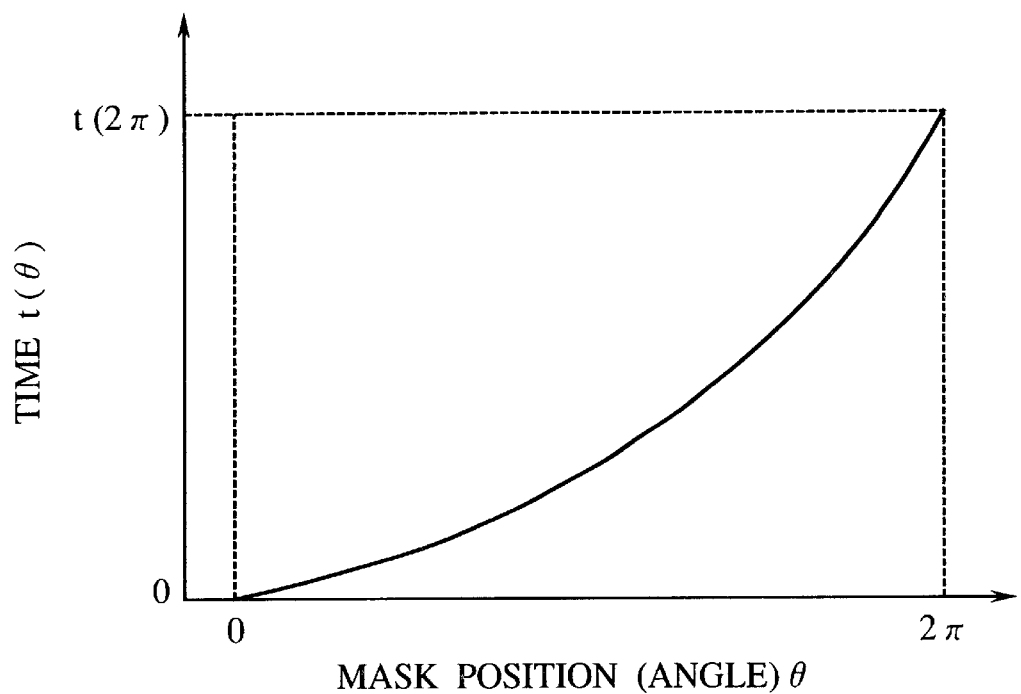
FIG. 8 is a graph of a time as a function of a mask position (angle) in the first exemplary case of the optical filter manufacturing method according to the present invention.
Figure 9:
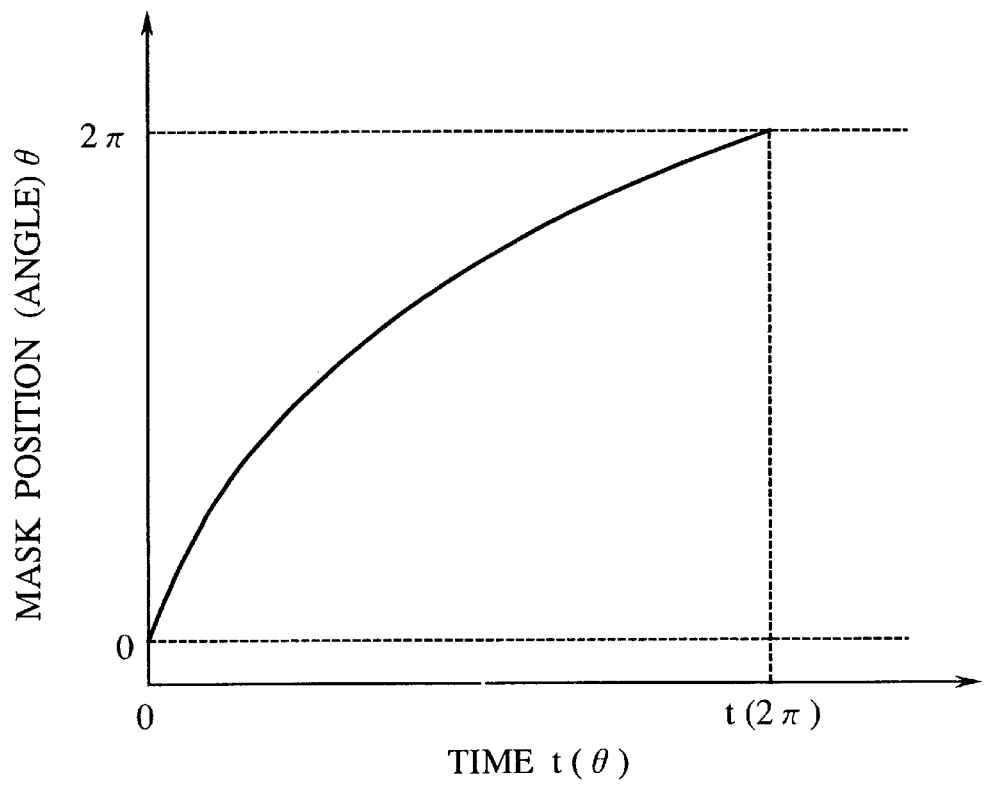
FIG. 9 is a graph of a mask position (angle) as a function of time in the first exemplary case of the optical filter manufacturing method according to the present invention.

FIG. 8 and FIG. 9 show a first exemplary case of using the mask 4 with the aperture 4a of an angle (as shown in FIG. 4 and realizing the thickness of deposition distribution given by:

$$T(\theta)=\alpha\theta+\beta$$

which varies linearly with respect to the rotation angle $\theta$ ($0 \leq \theta < 2\pi - \phi$) as shown in FIG. 5. In this case, the mask 4 is rotated according to a solution:

$$t(\theta) = p\theta^2 + q\theta$$

that satisfies the above equation (1). This $t(\theta)$ is depicted in a graph shown in FIG. 8. The angle change with respect to time is an inverse function of $t(\theta)$ which is depicted in a graph shown in FIG. 9. Here, $p = \alpha/(2A\phi)$ and $q = 1/A(\beta/\phi - \alpha/2)$. Also, since $t(\theta)$ is a monotonous function, $\alpha$ and $\beta$ must satisfy a relationship of $\beta/\alpha \geq \phi/2$.

Figure 10:
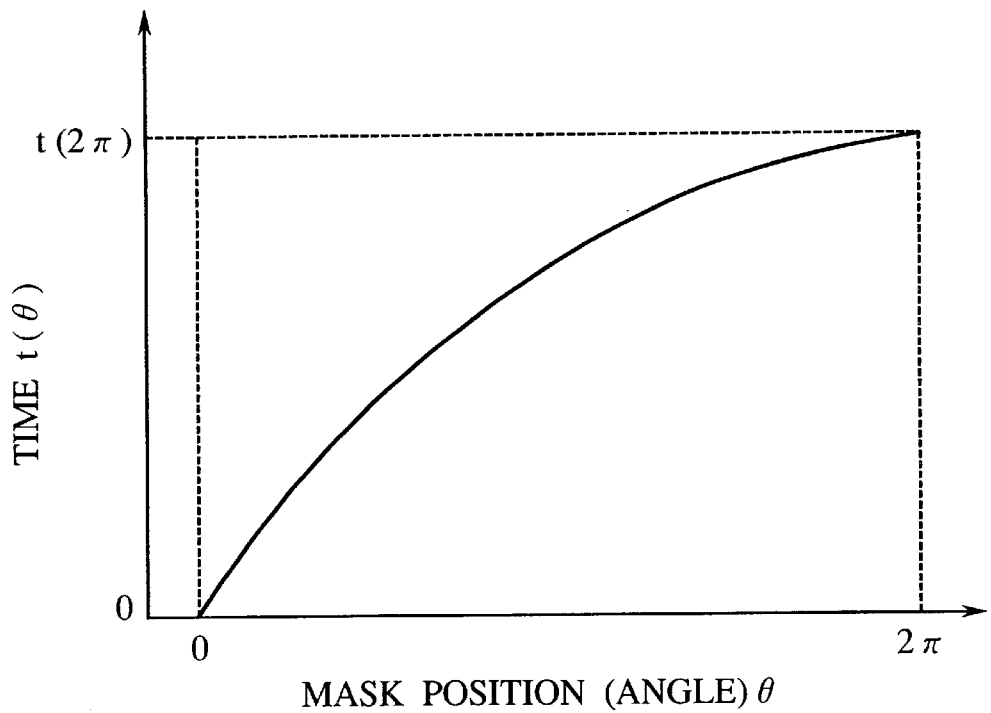
FIG. 10 is a graph of a time as a function of a mask position (angle) in the second exemplary case of the optical filter manufacturing method according to the present invention.
Figure 11:
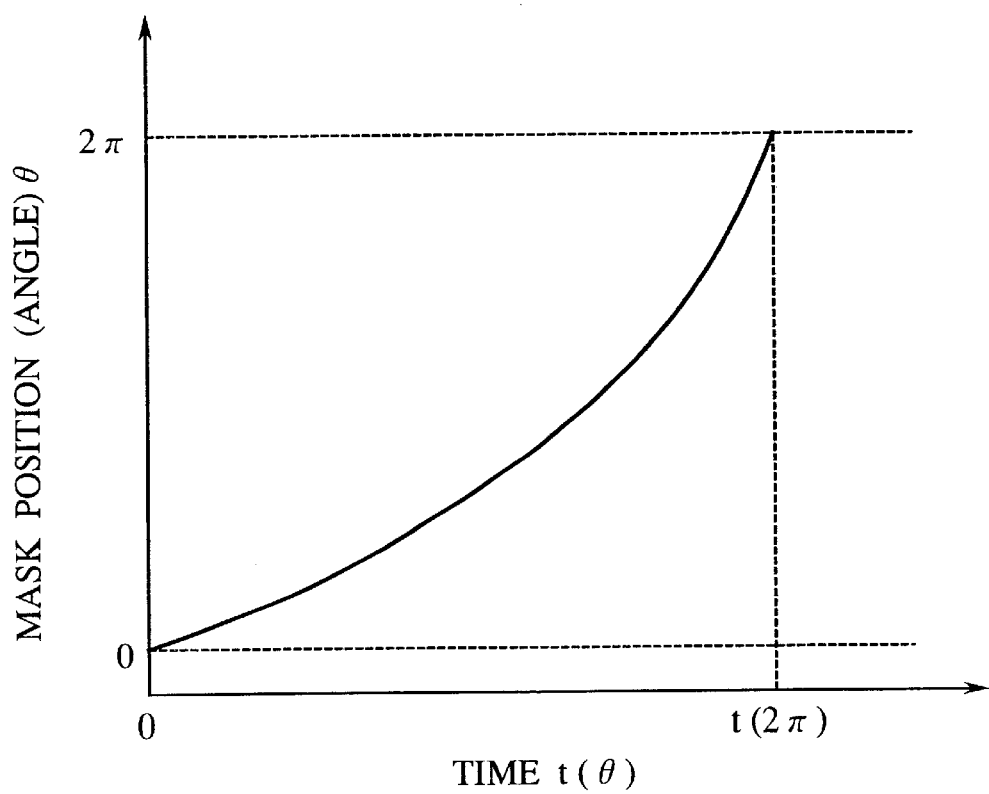
FIG. 11 is a graph of a mask position (angle) as a function of time in the second exemplary case of the optical filter manufacturing method according to the present invention.

FIG. 10 and FIG. 11 show a second exemplary case of using the mask 5 that covers an angle $\phi$ as shown in FIG. 6 and realizing the thickness of deposition distribution given by:

$$T(\theta) = \alpha\theta + \beta$$

which varies linearly with respect to the rotation angle $\theta$ ($0 \leq \theta < 2\pi - \phi$) as shown in FIG. 7. In this case, the mask 5 is rotated according to a solution:

$$t(\theta) = p\theta^2 + q\theta$$

that satisfies the above equation (2). This $t(\theta)$ is depicted in a graph shown in FIG. 10. The angle change with respect to time is an inverse function of $t(\theta)$ which is depicted in a graph shown in FIG. 11. Here, $p = -\alpha/(2A\phi)$ and $q = 1/A((A\tau - \beta)/\phi + \alpha/2)$, where $\tau$ denotes the rotation period $t(2\pi) - t(0)$ of the mask 5. Similarly as in the first example, since $t(\theta)$ is a monotonous function, $\alpha$ and $\beta$ must satisfy a relationship of $(\beta - A\tau)/\alpha < \phi/2$.

Figure 12:
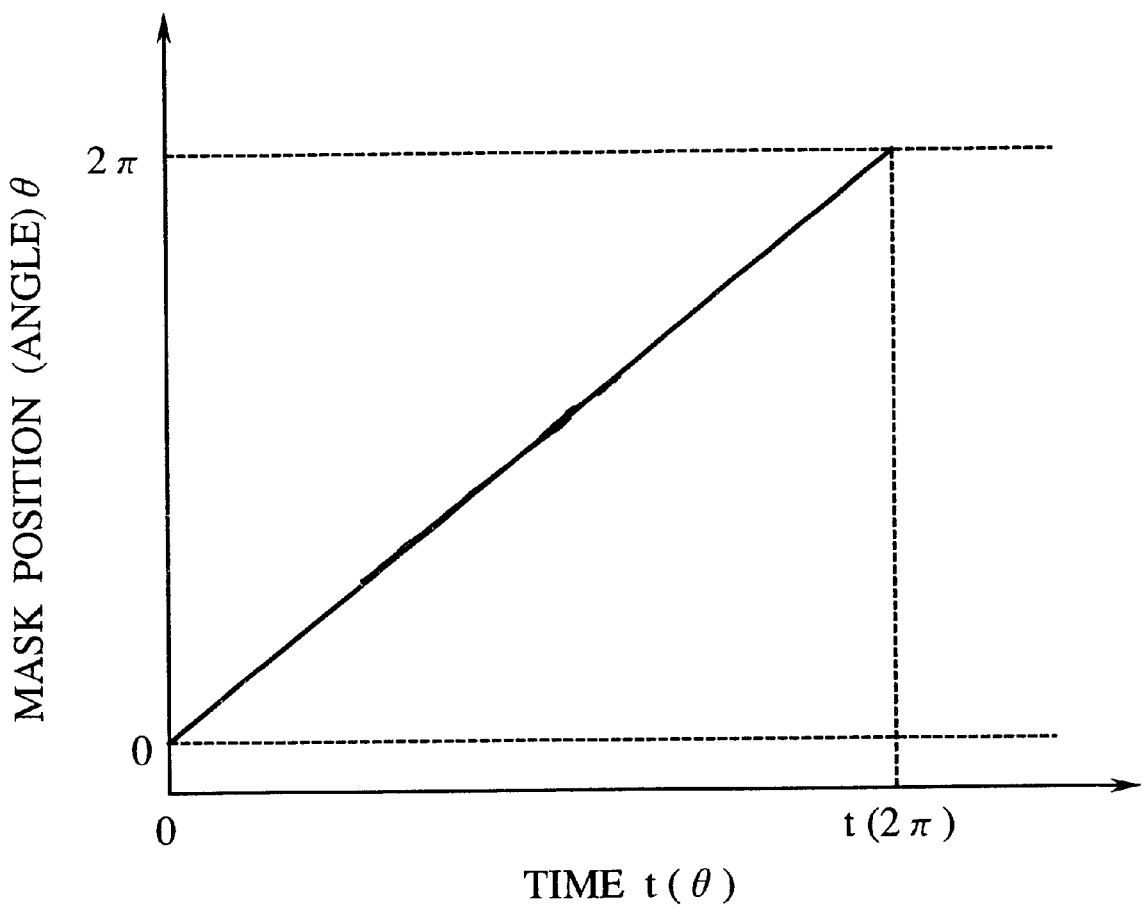
FIG. 12 is a graph of a mask position (angle) as a function of time in the third exemplary case of the optical filter manufacturing method according to the present invention.

FIG. 12 shows a third exemplary case of realizing the thickness of deposition distribution that is uniform with respect to the rotation angle $\theta$, which is given by:

$$T(\theta) = T\theta$$

Figure 13:
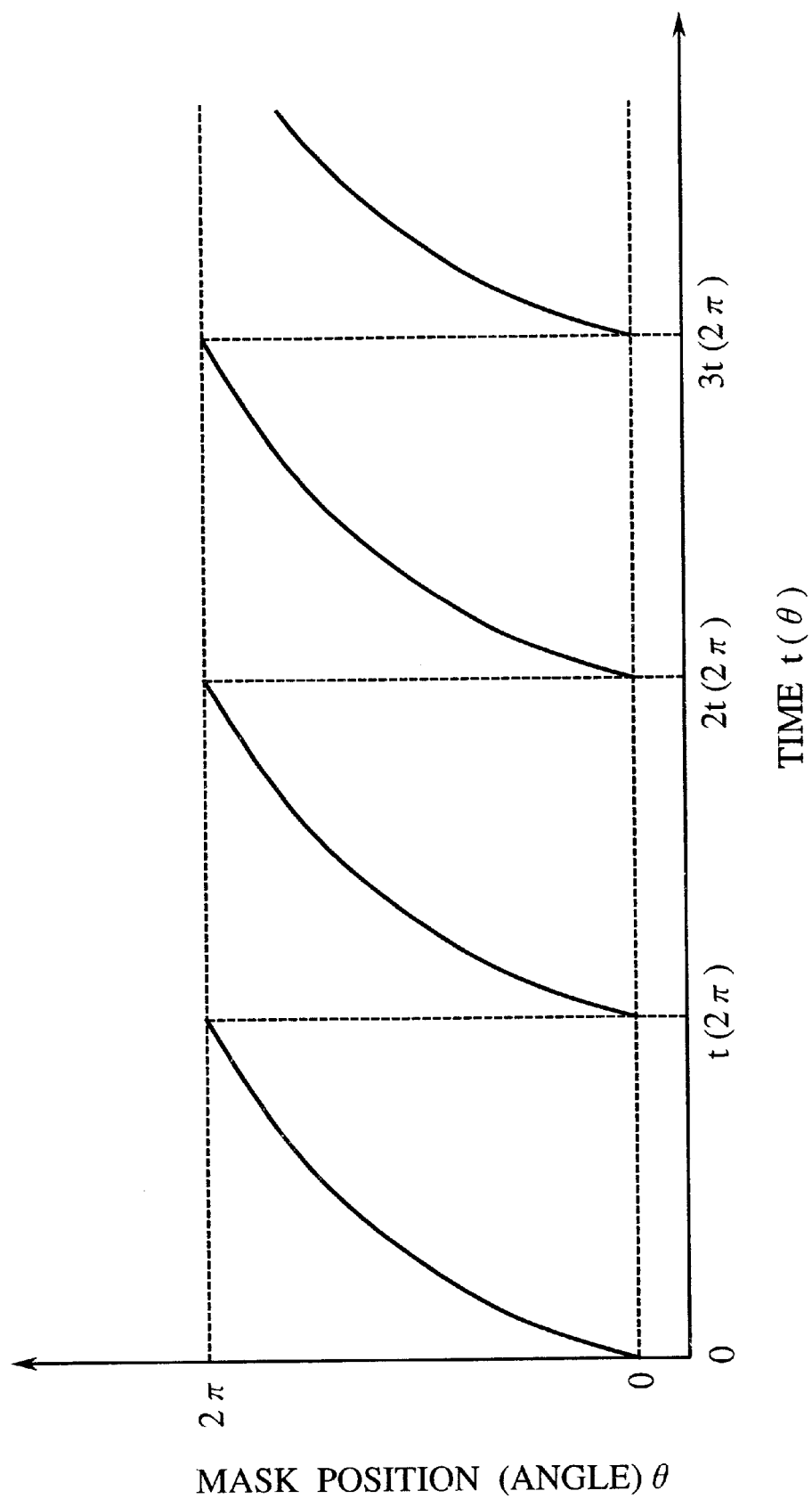
FIG. 13 is a graph of a mask position (angle) as a function of time in the fourth exemplary case of the optical filter manufacturing method according to the present invention.

In this case, the motion of the mask 4 or 5 is the constant speed motion, so that there is no discrepancy from the desired thickness of deposition $T(\theta)$ even at angles in a range of $2\pi - \phi \leq \theta < 2\pi$ FIG. 13 shows a fourth exemplary case in which the desired thickness of deposition distribution $T(\theta)$ is obtained by rotating the mask 4 or 5 for several times. instead of rotating the mask 4 or 5 just once as in the first to third examples.

In the case of using the mask 4 with the aperture 4a of an angle $\phi$ as shown in FIG. 4, the condition, by which the thickness of deposition distribution $T(\theta)/N$ can be obtained by a single rotation of the mask 4 is given by:

$$T(\theta) = AN[t(\theta + \phi) - t(\theta)] \quad (3)$$

so that by obtaining $t(\theta)$ that satisfies this condition (3) and rotating the mask 4 for N times using the periodic rotation speed as shown in FIG. 13, it is possible to obtain the thickness of deposition distribution $T(\theta)$ similar to the first and second examples described above.

Similarly, in the case of using the mask 5 that covers an angle $\phi$ as shown in FIG. 6, the condition by which the thickness of deposition distribution $T(\theta)/N$ can be obtained by a single rotation of the mask 5 is given by:

$$T(\theta) = AN[(t(2\pi) - t(0)) - (t(\theta + \phi) - t(\theta))] \quad (4)$$

so that by obtaining $t(\theta)$ that satisfies this condition (4) and rotating the mask 5 for N times, it is possible to obtain the thickness of deposition distribution $T(\theta)$ similar to the first and second examples described above.

In the case of obtaining the same thickness of deposition distribution using N rotations, the angular speed of the mask 4 or 5 becomes N times faster than the case of obtaining the same thickness of deposition distribution using a single rotation.

Note that, in the examples described above, the mask 4 or 5 is rotated with respect to the fixed substrate 1 at a time of depositing the dielectric material as shown in FIG. 4 or FIG. 6, but conversely it is also possible to rotate the substrate 1 with respect to the fixed mask 4 or 5 instead. In the case of using the mask 4 with the aperture 4a, the aperture 4a portion of the mask 4 is fixed and its area is relatively small so that the thickness of deposition distribution control becomes easier.

Note also that the case of forming a single layer of the dielectric film from a single type of dielectric material is described above, but it is also possible to repeat the above described procedure by using a plurality of dielectric materials having different refractive indices so as to form a multi-layer structure with a variety of thickness of deposition distributions on the substrate. Even in this case, it is possible to use a single mask 4 or 5 in order to realize a variety of thickness of deposition distributions. Also, in such a case, the angular speed of the mask with respect to the substrate can be set differently for different layers such that different layers have different thickness of deposition distributions, where some layer may have a constant thickness of deposition distribution.

In the case where the deposition rate of the dielectric material varies in time, it is possible to provide a deposition rate monitoring device within the deposition chamber and carry out a feedback control of the rotation speed of the mask or the substrate according to the output of the monitoring device. For the monitoring device, it is possible to use a quartz oscillator whose oscillation frequency becomes smaller as the dielectric material is deposited on an oscillation surface of the quartz, for example. The feedback control can be made such that, when the deposition rate varies in time, the rotation speed of the mask is increased or decreased in proportion to the deposition rate Using a difference equation so as to realize a faster rotation speed for a faster deposition rate. In this way, it becomes possible to realize the film formation similar to that in the case of the constant deposition rate.

In the case where the substrate is to be rotated, the rotation speed of the substrate at a time of depositing the dielectric material can be detected from the control signal given to the driving device (motor) for rotating the substrate, but it is more preferable to directly detect the rotation of the substrate in order to improve the accuracy To this end, it is possible to provide encoder marks on the substrate, while providing an encoder mark reading device within the deposition chamber. Then, the relative rotation of the substrate and the mask can be controlled according to signals outputted from the encoder marking reading device. Namely, the encoder marks provided along a rotation direction of the substrate can be counted optically so as to measure the actual amount of rotation, and the measured value can be supplied to a motor controller as a feedback.

Figure 14:
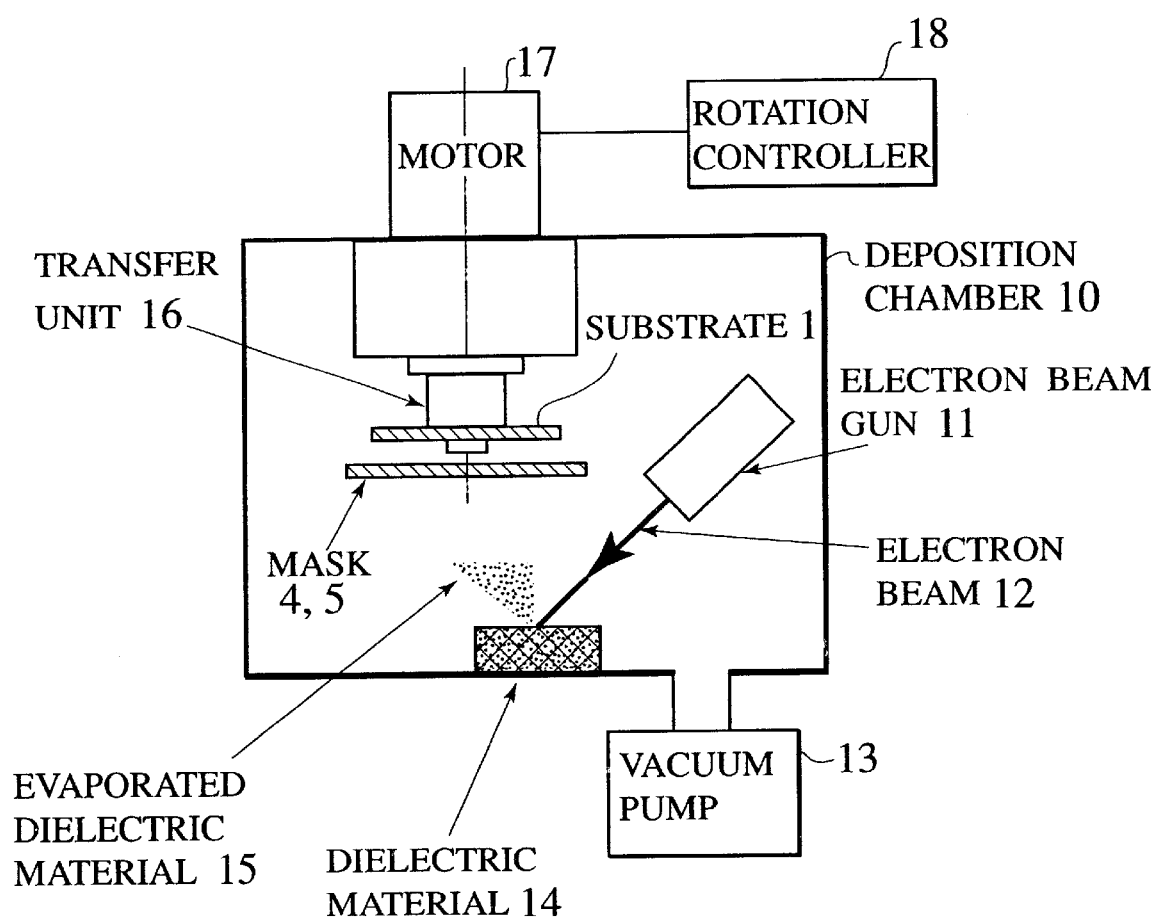
FIG. 14 is a schematic block diagram showing an exemplary configuration of an optical filter manufacturing apparatus for realizing the optical filter manufacturing method according to the present invention.

There is a need to carry out the deposition of the dielectric material within the deposition chamber that is kept in a vacuum state, and in this case, the mask or the substrate is to be driven into rotations from an external of the deposition chamber. FIG. 14 shows an exemplary configuration of an optical filter manufacturing apparatus for realizing the optical filter manufacturing method of the present invention, in the case of using the electron beam vapor deposition method. In the configuration of FIG. 14, the deposition chamber 10 is kept in a vacuum state by a vacuum pump 13, and an electron beam 12 is irradiated from an electron beam gun 11 onto a dielectric material 14 so as to produce evaporated dielectric material 15 that is deposited onto the substrate 1 from the side of the mask 4 or 5 within the deposition chamber 10. The substrate 1 is mounted inside the deposition chamber 10 in a form of a transfer unit 16 to be described below, and the substrate 1 or the mask 4 or 5 that is provided over the substrate 1 is driven into rotations by a motor 17 that is provided outside the deposition chamber 10 and controlled by a rotation controller 18. Here, as shown in FIG. 15, the mask or the substrate can be rotated by using a motor from the external of the deposition chamber through a vacuum retention mechanism called hermetic sealing 23.

Figure 15:
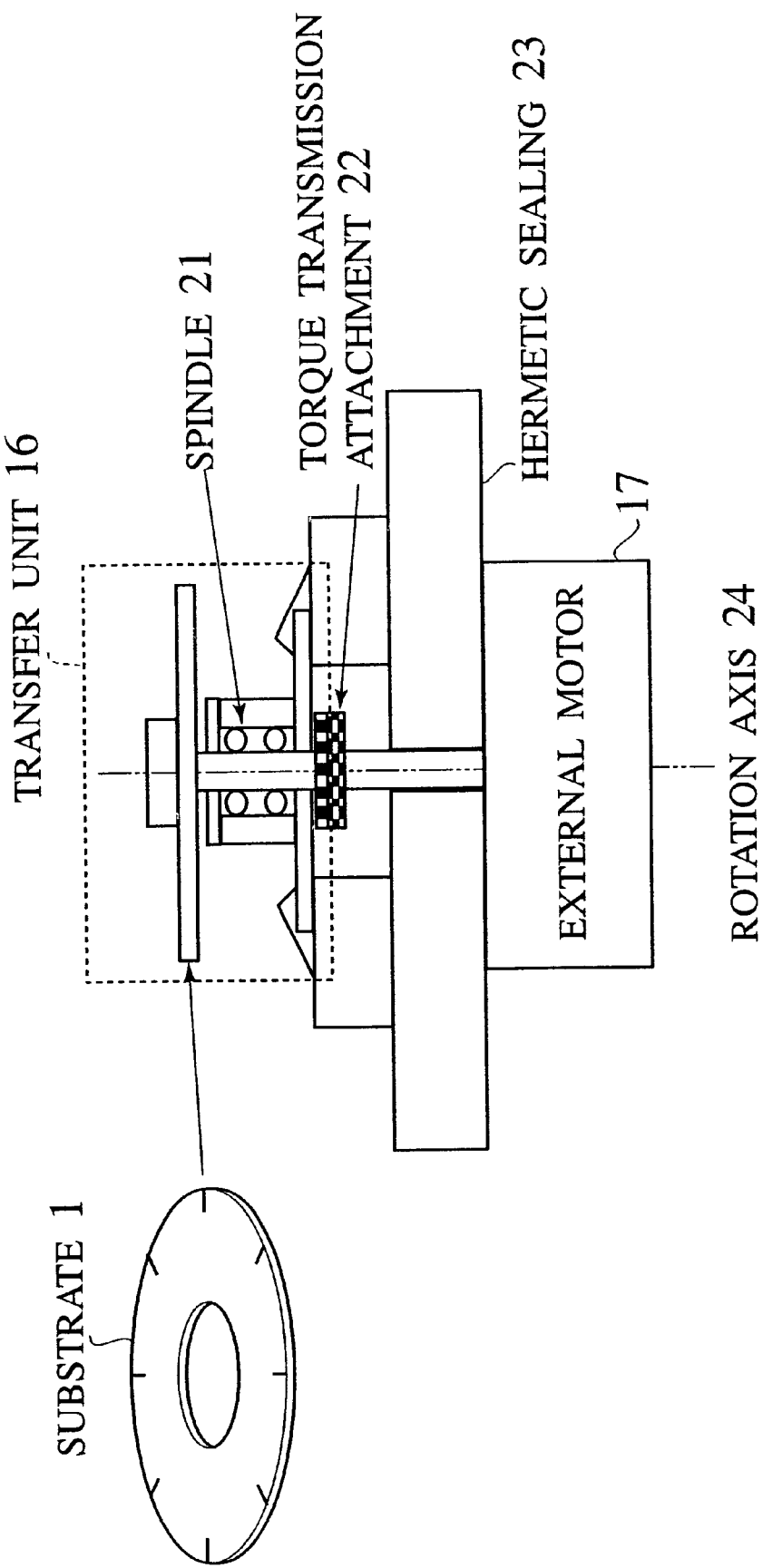
FIG. 15 is a diagram showing an exemplary configuration related to a transfer unit used in the optical filter manufacturing apparatus of FIG. 14.

As shown in an example of FIG. 15, in order to maintain the positioning precision of the rotation axes of the substrate and the mask, the transfer unit 16 is formed by the substrate 1, a spindle 21 on which the substrate 1 is attached without any eccentricity with respect to the spindle 21, and a torque transmission attachment 22 for transmitting torque from the motor 17 provided outside the deposition chamber to the spindle 21.

Then, a mechanism for aligning the rotation center of the substrate contained in the transfer unit that is transferred into the deposition chamber with the rotation axis transmitting the torque from the motor which drives the substrate from the external of the deposition chamber can be provided within the deposition chamber. For example, the torque transmission attachment 22 can be provided with a projection and an indentation for positioning purpose on its transfer unit side and motor side, such that the transfer unit 16 can be automatically aligned with respect to the motor 17 by engaging the projection and the indentation at a time of setting the transfer unit 16. As another example, in the case of using the substrate 1 having encoder marks provided thereon as shown in FIG. 15, the rotation center of the substrate 1 can be optically detected by monitoring the encoder marks while rotating the substrate 1, and the rotation axis can be appropriately adjusted according to the detection result, using an adjustment mechanism provided in advance.

Also, in view of the fact that breaking of the vacuum state of the deposition chamber every time the substrate is to be exchanged can lead to the increase in the manufacturing time and manufacturing cost, it is possible to provide a mechanism that enable the exchange of the substrate while maintaining the vacuum state of the deposition chamber. For example, it is also possible to provide an anteroom for stocking a plurality of transfer units independently from the deposition chamber for forming optical thin films, such that the transfer unit can be transferred in or out of the deposition chamber from the anteroom.

Figure 16:
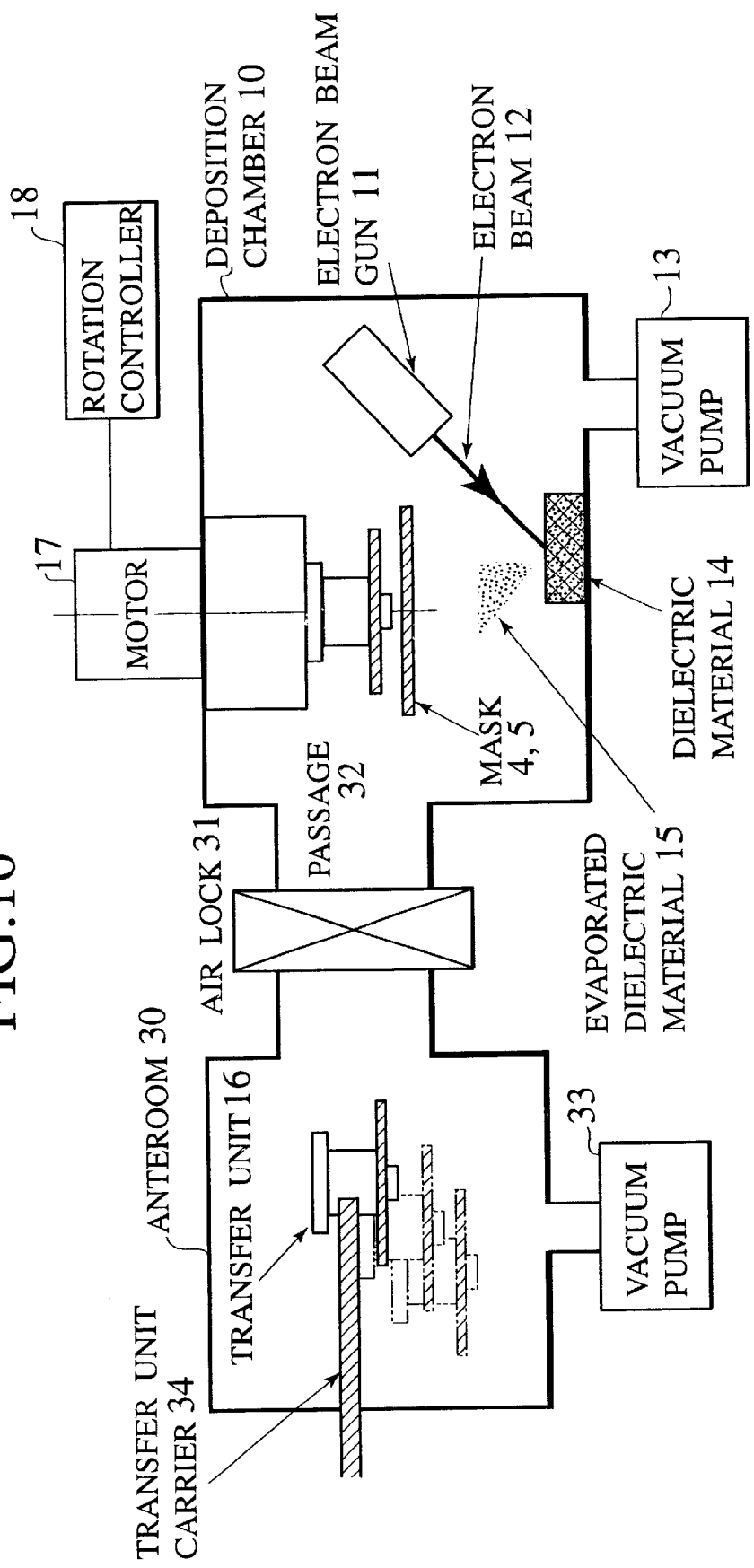
FIG. 16 is a schematic block diagram showing another exemplary configuration of an optical filter manufacturing apparatus for realizing the optical filter manufacturing method according to the present invention.

Namely, as shown in FIG. 16, the anteroom 30 equipped with a vacuum pump 33 can be connected to the deposition chamber 10 through a passage 32 equipped with an air lock 31, and the transfer unit 16 can be stocked in the anteroom 30 and transferred in or out of the deposition chamber 10 from the anteroom 30 using a transfer unit carrier 34 provided at the anteroom 30. In the configuration of FIG. 16, the deposition chamber 10 is kept in a high level vacuum state, while the anteroom 30 is put into a vacuum state that is at equal or lower level compared with the deposition chamber 10 after plural transfer units 16 are stocked inside. Then, for each transfer unit 16 stocked in the anteroom 30, the following operation is repeated. Namely, the air lock 31 between the anteroom 30 and the deposition chamber 10 is opened, and one transfer unit 16 is carried from the anteroom 30 to the deposition chamber 10 and set inside the deposition chamber 10. Then, the air lock 31 is closed and the deposition chamber 10 is put into a vacuum state in accordance with the film formation condition, and the film formation is carried out inside the deposition chamber 10. After the film formation is completed, the air lock 31 is opened and the transfer unit 16 is taken out from the deposition chamber 10. In this way, it becomes possible to manufacture the optical filters sequentially without breaking the vacuum state of the deposition chamber. This provision is suitable for the mass production.

As an exemplary method for depositing the dielectric material, it is possible to use the electron beam vapor deposition method. This is a method in which the electron beams are irradiated onto the dielectric material to heat it until it is evaporated and then the evaporated dielectric material is deposited on the substrate, which is a generally used optical thin film formation method.

As another exemplary method for depositing the dielectric material, it is also possible to use the electron cyclotron resonance (ECR) sputtering method. This is a method in which the electrons are set in resonance vibrations using the microwaves to turn gas into plasma, and the obtained plasma gas and the dielectric material are set in reaction so as to deposit the optical thin film. This method has features that it can form very fine films and that it can freely change the film composition.

It is also possible to use the ion assisted electron beam vapor deposition method in which the dielectric material evaporated by the electron beam is ionized using microwaves and then deposited, the vacuum vapor deposition method in which the dielectric material is evaporated by Joule heat using electric resistors, the ion beam sputtering method in which the rare gas filled inside the deposition chamber is ionized by irradiating microwave beam and obtained ions are collided onto the dielectric material to evaporate it, or the radio frequency (RF) sputtering method in which the rare gas filled inside the deposition chamber is ionized by applying a radio frequency electric field and obtained ions are collided onto the dielectric material to evaporate it.

As described, according to the present invention, the mask with an aperture or the mask that covers a partial angle range of the substrate is used and the dielectric material is deposited while the mask is relatively rotated with respect to the substrate at a time of file formation using the dielectric material, so that it is possible to manufacture the optical filter in such a manner that the transmission wavelength varies linearly with respect to the rotation angle θ of the optical filter and that almost the entire range of the rotation angle θ is utilizable as the optical filter. In addition, by selecting the rotation motion of the mask or the substrate, it is possible to realize a variety of thickness of deposition distributions by using a single mask.

It is to be noted that it is not absolutely necessary for the aperture 4a of the mask 4 and the mask 5 itself to be extended from the rotation center as depicted in FIG. 4 and FIG. 6, and they can be provided in forms extending for any desired length along the radius direction according to the need.

It is also to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method for manufacturing a disk optical filter, comprising the steps of:

providing a mask over a substrate, the mask being capable of being relatively rotated with respect to the substrate coaxially on a plane parallel to the substrate and the mask having an aperture extending along a radius direction with an aperture angle φ; and depositing a dielectric material in a single layer or multiple layers on the substrate from the mask side within a deposition chamber, while relatively rotating the mask with respect to the substrate at least once at a non-constant angular speed during a formation of the single layer or the multiple layers on the substrate so as to form the disk optical filter in which the transmission wavelength increases or decreases with respect to angle in a rotation direction of the substrate except for an angular zone φ.

2. The method of claim 1, wherein the depositing step relatively rotates the mask with respect to the substrate once such that a time t(θ) as a function of a relative rotation of an angle θ of the mask with respect to the substrate satisfies:

$$T(\theta)=A[t(\theta+\phi)-t(\theta)]$$

where T(θ) (0≤θ<2π−φ) is a desired thickness of deposition of the dielectric material as a function of the mask's relative rotation of an angle θ and A is a thickness of deposition of the dielectric material per unit time.

3. The method of claim 1, wherein the depositing step relatively rotates the mask with respect to the substrate N times such that a time t(θ) as a function of a relative rotation angle θ of the mask with respect to the substrate satisfies:

$$T(\theta)=AN[t(\theta+\phi)-t(\theta)]$$

where T(θ) (0≤θ<2π−φ) is a desired thickness of deposition of the dielectric material as a function of the mask's rotation angle θ and A is a thickness of deposition of the dielectric material per unit time.

4. The method of claim 1, further comprising the step of: repeating the depositing step using a plurality of dielectric materials having different refractive indices so as to form a multi-layer structure on the substrate.

5. The method of claim 1, further comprising the steps of:

monitoring a deposition speed of the dielectric material by using a monitoring device; and providing a feedback control to the relative rotation speed of the mask according to an output of the monitoring device.

6. The method of claim 1, further comprising the steps of:

reading an encoder mark provided on the substrate by using an encoder mark reading device; and controlling a relative rotation of the mask with respect to the substrate according to an output of the encoder mark reading device.

7. The method of claim 1, wherein at the depositing step the substrate or the mask is rotated by a motor connected to the substrate or the mask from an external of the deposition chamber through a vacuum retention mechanism.

8. The method of claim 7, further comprising the step of:

setting the substrate in the deposition chamber in a form of a transfer unit formed by the substrate and a mechanism for transmitting torque from the motor to the substrate or the mask.

9. The method of claim 8, wherein the setting unit sets the transfer unit in the deposition chamber by aligning the rotation center on the substrate contained in the transfer unit with a rotation axis transmitting the torque from the motor to the substrate.

10. The method of claim 8, further comprising the steps of:

stocking a plurality of transfer units in an anteroom of the deposition chamber; and sequentially transferring each transfer unit in and out of the deposition chamber from the anteroom without breaking a vacuum state of the deposition chamber, before and after the depositing step.

11. The method of claim 1, wherein the depositing step deposits the dielectric material by using any one of an electron beam vapor deposition method, an electron cyclotron resonance sputtering method, an ion assisted electron beam vapor deposition method, a vacuum vapor deposition method, an ion beam sputtering method, and a radio frequency sputtering method.

12. A method for manufacturing a disk optical filter, comprising the steps of:

providing a mask over a substrate, the mask being capable of being rotated relatively with respect to the substrate coaxially on a plane parallel to the substrate and the mask extending along a radius direction to cover an angle φ; and depositing a dielectric material in a single layer or multiple layers on the substrate from the mask side within a deposition chamber, while relatively rotating the mask with respect to the substrate at least once at a non-constant angular speed during a formation of the single layer or the multiple layers on the substrate so as to form the disk optical filter in which the transmission wavelength increases or decreases with respect to angle in a rotation direction of the substrate except for an angular zone φ.

13. The method of claim 12, wherein the depositing step relatively rotates the mask with respect to the substrate once such that a time t(θ) as a function of a relative rotation of an angle θ of the mask with respect to the substrate satisfies:

$$T(\theta)=A[(t(2\pi)-t(0))-(t(\theta+\phi)-t(\phi))]$$

where T(φ) (0≤φ≤2π−φ) is a desired thickness of deposition of the dielectric material as a function of the mask's relative rotation angle θ and A is a thickness of deposition of the dielectric material per unit time.

14. The method of claim 12, wherein the depositing step relatively rotates the mask with respect to the substrate N times such that a time t(θ) as a function of a relative rotation of an angle θ of the mask with respect to the substrate satisfies:

$$T(\theta)=AN[(t(2\pi)-t(0))-(t(\theta+\phi)-t(\phi))]$$

where T(θ) (0≤(θ)≤2π−φ) is a desired thickness of deposition of the dielectric material as a function of the mask's relative rotation angle θ and A is a thickness of deposition of the dielectric material per unit time.

15. The method of claim 12, further comprising the step of:

repeating the depositing step using a plurality of dielectric materials having different refractive indices so as to form a multi-layer structure on the substrate.

16. The method of claim 12, further comprising the steps of:

monitoring a deposition speed of the dielectric material by using a monitoring device; and providing a feedback control to the rotation speed of the mask according to an output of the monitoring device.

17. The method of claim 12, further comprising the steps of:

reading an encoder mark provided on the substrate by using an encoder mark reading device; and controlling a relative rotation of the mask with respect to the substrate according to an output of the encoder mark reading device.

18. The method of claim 12, wherein at the depositing step the substrate or the mask is rotated by a motor connected to the substrate or the mask from an external of the deposition chamber through a vacuum retention mechanism.

19. The method of claim 18, further comprising the step of:

setting the substrate in the deposition chamber in a form of a transfer unit formed by the substrate and a mechanism for transmitting torque from the motor to the substrate or the mask.

20. The method of claim 19, wherein the setting unit sets the transfer unit in the deposition chamber by aligning the rotation center on the substrate contained in the transfer unit with a rotation axis transmitting the torque from the motor to the substrate.

21. The method of claim 19, further comprising the steps of:

stocking a plurality of transfer units in an anteroom of the deposition chamber; and sequentially transferring each transfer unit in and out of the deposition chamber from the anteroom without breaking a vacuum state of the deposition chamber, before and after the depositing step.

22. The method of claim 12, wherein the depositing step deposits the dielectric material by using any one of an electron beam vapor deposition method, an electron cyclotron resonance sputtering method, an ion assisted electron beam vapor deposition method, a vacuum vapor deposition method, an ion beam sputtering method, and a radio frequency sputtering method.

* * * * *